(12) United States Patent
Bao et al.

(10) Patent No.: US 10,777,469 B2
(45) Date of Patent: Sep. 15, 2020

(54) SELF-ALIGNED TOP SPACERS FOR VERTICAL FETS WITH IN SITU SOLID STATE DOPING

(71) Applicant: INTERNATIONAL BUSINESS MACHINES CORPORATION, Armonk, NY (US)

(72) Inventors: Ruqiang Bao, Niskayuna, NY (US); Junli Wang, Slingerlands, NY (US); Brent A. Anderson, Jericho, VT (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/157,786

(22) Filed: Oct. 11, 2018

(65) Prior Publication Data

US 2020/0118890 A1 Apr. 16, 2020

(51) Int. Cl.

| H01L 21/8238 | (2006.01) |
|---|---|
| H01L 29/49 | (2006.01) |
| H01L 29/51 | (2006.01) |
| H01L 29/66 | (2006.01) |
| H01L 21/225 | (2006.01) |
| H01L 27/092 | (2006.01) |
| H01L 21/762 | (2006.01) |
| H01L 29/78 | (2006.01) |

(52) U.S. Cl.
CPC .. *H01L 21/823885* (2013.01); *H01L 21/2255* (2013.01); *H01L 21/76229* (2013.01); *H01L 21/823864* (2013.01); *H01L 27/092* (2013.01); *H01L 29/4966* (2013.01); *H01L 29/517* (2013.01); *H01L 29/6656* (2013.01); *H01L 29/66666* (2013.01); *H01L 29/7827* (2013.01)

(58) Field of Classification Search
CPC ..... H01L 21/823885; H01L 21/823864; H01L 21/225–2255; H01L 29/6656; H01L 29/517; H01L 27/092; H01L 21/76229; H01L 29/66666; H01L 29/4966; H01L 21/2255; H01L 29/7827
See application file for complete search history.

(56) References Cited

U.S. PATENT DOCUMENTS

| 7,453,113 | B2 * | 11/2008 | Ouyang | H01L 29/778 |
|---|---|---|---|---|
| | | | | 257/302 |
| 9,514,995 | B1 * | 12/2016 | Fogel | H01L 21/82387 |
| 9,525,064 | B1 | 12/2016 | Balakrishnan et al. | |
| 9,570,356 | B1 | 2/2017 | Balakrishnan et al. | |
| 9,583,489 | B1 * | 2/2017 | Anderson | H01L 27/0921 |
| 9,640,636 | B1 | 5/2017 | Bentley et al. | |
| 9,768,085 | B1 | 9/2017 | Cheng et al. | |
| 9,831,317 | B1 | 11/2017 | Zang et al. | |
| 9,935,195 | B1 | 4/2018 | Xu et al. | |
| 9,947,649 | B1 | 4/2018 | Balakrishnan et al. | |
| 10,002,793 | B1 * | 6/2018 | Shu | H01L 21/823821 |
| 10,396,208 | B2 * | 8/2019 | Cheng | H01L 29/66666 |

(Continued)

*Primary Examiner* — Bac H Au
(74) *Attorney, Agent, or Firm* — Tutunjian & Bitetto, P.C.; Vazken Alexanian (57) ABSTRACT

Semiconductor devices and methods of forming the same include forming a doped dielectric layer on a semiconductor fin. The doped dielectric layer is annealed to drive dopants from the doped dielectric layer into the semiconductor fin. A gate stack is formed on the semiconductor fin.

16 Claims, 6 Drawing Sheets

(56) References Cited

U.S. PATENT DOCUMENTS

| | | | |
|---|---|---|---|
| 2011/0309333 A1* | 12/2011 | Cheng | B82Y 10/00 |
| | | | 257/24 |
| 2013/0115763 A1 | 5/2013 | Takamure et al. | |
| 2016/0056156 A1* | 2/2016 | Ghani | H01L 21/82382 |
| | | | 257/401 |
| 2017/0062280 A1* | 3/2017 | Li | H01L 27/0924 |
| 2017/0256409 A1* | 9/2017 | Leobandung | H01L 27/0921 |
| 2017/0288056 A1 | 10/2017 | Balakrishnan et al. | |
| 2018/0068904 A1 | 3/2018 | Adusumilli et al. | |
| 2018/0097111 A1* | 4/2018 | Zhu | H01L 29/66666 |
| 2019/0013203 A1* | 1/2019 | Sreenivasan | H01L 21/2254 |
| 2019/0311958 A1* | 10/2019 | Lee | H01L 21/324 |
| 2019/0378767 A1* | 12/2019 | Bao | H01L 27/092 |

\* cited by examiner

SELF-ALIGNED TOP SPACERS FOR VERTICAL FETS WITH IN SITU SOLID STATE DOPING

BACKGROUND

Technical Field

The present invention generally relates to semiconductor device fabrication and, more particularly, to the formation of vertical field effect transistors.

Description of the Related Art

Field effect transistors (FETs) are conventionally formed with a gate structure positioned between horizontally aligned source and drain regions. Vertical FETs, meanwhile, are formed with a gate and channel positioned between vertically aligned source and drain regions. This orientation poses certain difficulties in fabrication, for example in managing junction resistance.

SUMMARY

A method of forming a semiconductor device includes forming a doped dielectric layer on a semiconductor fin. The doped dielectric layer is annealed to drive dopants from the doped dielectric layer into the semiconductor fin. A gate stack is formed on the semiconductor fin.

A method of forming an integrated chip includes forming a first doped dielectric layer having a dopant of a first conductivity type on a first semiconductor fin. A second doped dielectric layer having a dopant of a second conductivity type is formed on a second semiconductor fin. The first doped dielectric layer and the second doped dielectric layer are annealed to drive dopants from the respective doped dielectric layers into the respective semiconductor fins. A first gate stack is formed on the first semiconductor fin. A second gate stack is formed on the second semiconductor fin.

A semiconductor device includes a semiconductor fin that has a doped upper junction region, a doped lower junction region, and an undoped channel region. An doped dielectric layer is formed on sidewalls of the semiconductor fin in contact with at least one of the doped junction regions. A gate stack is formed on sidewalls of the semiconductor fin in contact with the undoped channel region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use in situ, solid-state doping of the junctions of a vertical field effect transistor (FET). This can be performed by forming a doped dielectric layer on the junctions and performing an anneal that drives dopants from the oxide layer into the semiconductor material in the source and drain regions (also referred to herein as "junctions") to lower the extension resistance. Although the present embodiments are described with particular attention to FETs, it should be understood that the present principles can also be applied to bipolar junction transistors.

The present embodiments will be described with particular focus on an embodiment that uses in situ solid-state doping for both the top junction and the bottom junction. However, other embodiments are contemplated where only one of the junctions is doped in this fashion, while the other junction may be doped by implantation or by in situ doping during an epitaxial growth process. In still other embodiments, the solid-state doping of the present embodiments can be used to further enrich the dopant of an already-doped structure.

Figure 1:
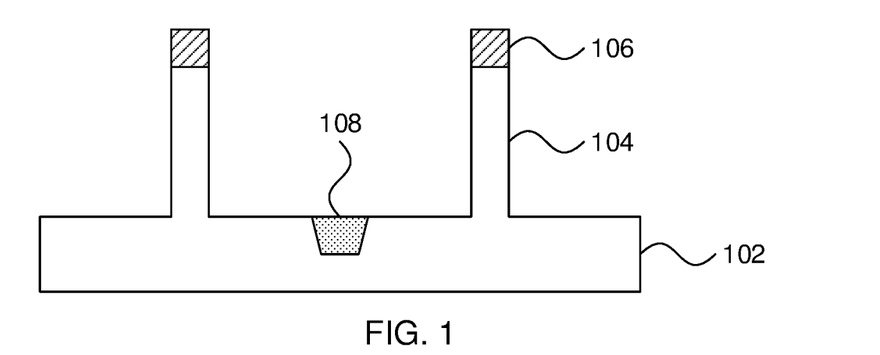
FIG. 1 is a cross-sectional diagram of a step in the formation of vertical transistors with solid-state in situ junction doping that shows the formation of vertical semiconductor fins in accordance with an embodiment of the present invention.

Referring now to FIG. 1, a cross-sectional view of a step in the fabrication of a semiconductor device is shown. A set of fins 104 are formed on a semiconductor substrate 102, separated by a shallow trench isolation region 108. The fins 104 can be formed by, for example, forming masking structures 106 on a top surface of the semiconductor structure 102 and then anisotropically etching down into the semiconductor structure using, e.g., a reactive ion etch (RIE).

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fins 104 can be formed by spacer imaging transfer in one step or multiple steps.

Figure 2:
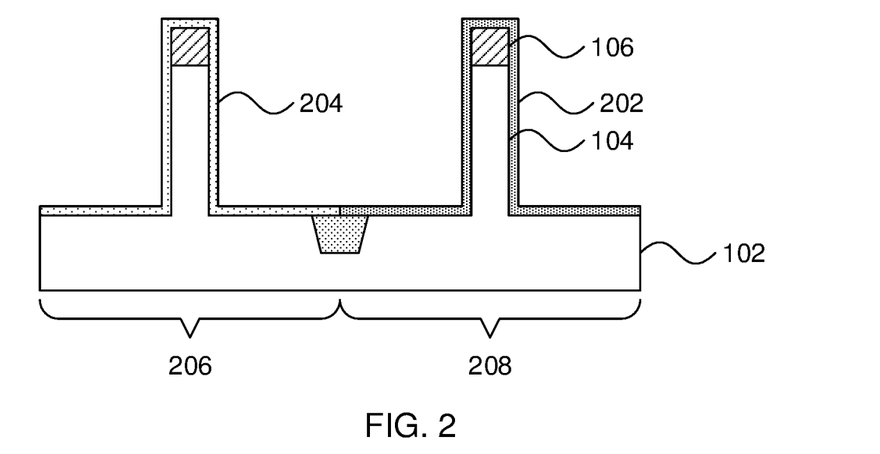
FIG. 2 is a cross-sectional diagram of a step in the formation of vertical transistors with solid-state in situ junction doping that shows the formation of doped dielectric layers over the semiconductor fins in accordance with an embodiment of the present invention.

Referring now to FIG. 2, a cross-sectional view of a step in the fabrication of a semiconductor device is shown. The shallow trench isolation region 108 defines a first device region 206 and a second device region 208. Although a shallow trench isolation region is used for this purpose in the present embodiments, it should be understood that any form of electrical separation between the two devices may be employed, including simple separation between one another on a chip. Respective doped oxide layers are deposited over the device regions.

In one particular embodiment, it is contemplated that the device regions are used to form devices of differing conductivity types. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Thus, an embodiment may include an n-type FET (nFET) region 206 and a p-type FET (pFET) region 208. It should be understood that, in other embodiments, the regions' positions may be switched. In still other embodiments, the two regions may have a same conductivity type, whether n-type or p-type. In further embodiments, only one device region may employed.

Respective doped dielectric layers are deposited over the nFET region 206 and the pFET region. The doped dielectric layers may be formed by masking one device region, conformally depositing a layer of doped dielectric material on the exposed device region, removing the mask from the first device region, masking the second device region, and depositing another layer of doped dielectric material on the first device region. In one specific example, an n-type doped oxide layer 204 can be deposited over the fin 104 in the nFET region 206 and a p-type doped oxide layer 202 can be deposited over the fin 104 in the pFET region. In one specific embodiment, the n-type doped oxide can include phosphosilicate glass and the p-type doped oxide can include borosilicate glass. The doping concentration for the doped oxide layers can be between about $1e^{19}$ and about $5e^{21}$ atoms/cm$^3$ for both phosphosilicate glass and borosilicate glass, although the concentration for these two films could be different. The film thickness can be between about 1 nm to about 5 nm. The film thickness could be different. Any appropriate conformal deposition process can be used including, for example including chemical vapor deposition (CVD), atomic layer deposition (ALD), or physical vapor deposition (PVD).

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 3:
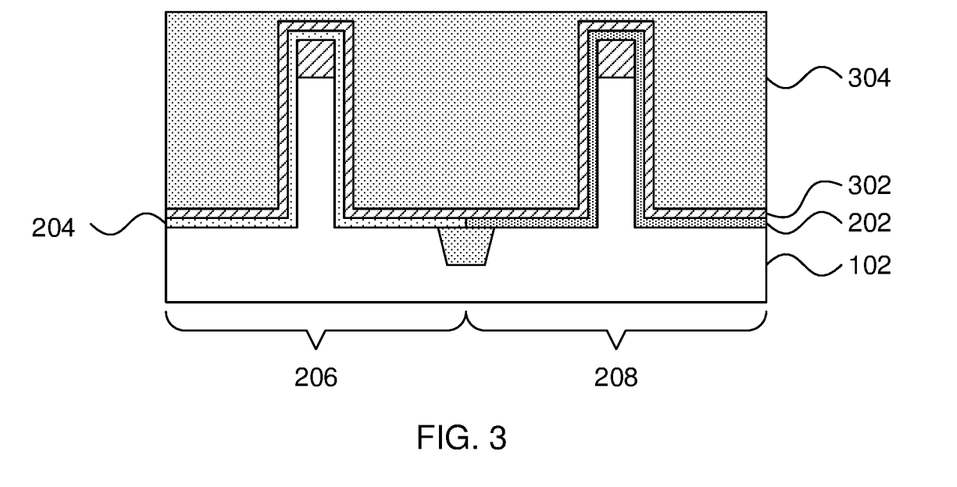
FIG. 3 is a cross-sectional diagram of a step in the formation of vertical transistors with solid-state in situ junction doping that shows the formation of dielectric layers over the doped dielectric layers in accordance with an embodiment of the present invention.

Referring now to FIG. 3, a cross-sectional view of a step in the fabrication of a semiconductor device is shown. A protective dielectric layer 302 is formed over the doped oxide layers 202 and 204. It is specifically contemplated that the protective dielectric layer may be formed from, e.g., silicon nitride, but any appropriate material that is selectively etchable with respect to the doped oxide layers may be used. As used herein, the term "selective" in reference to a material removal process denotes that the rate of material removal for a first material is greater than the rate of removal for at least another material of the structure to which the material removal process is being applied. A dummy fill layer 304 is then deposited over the protective layer 302. It is specifically contemplated that any appropriate dielectric material may be used, such as silicon dioxide, and may be formed by any appropriate deposition process, such as a flowable CVD.

Figure 4:
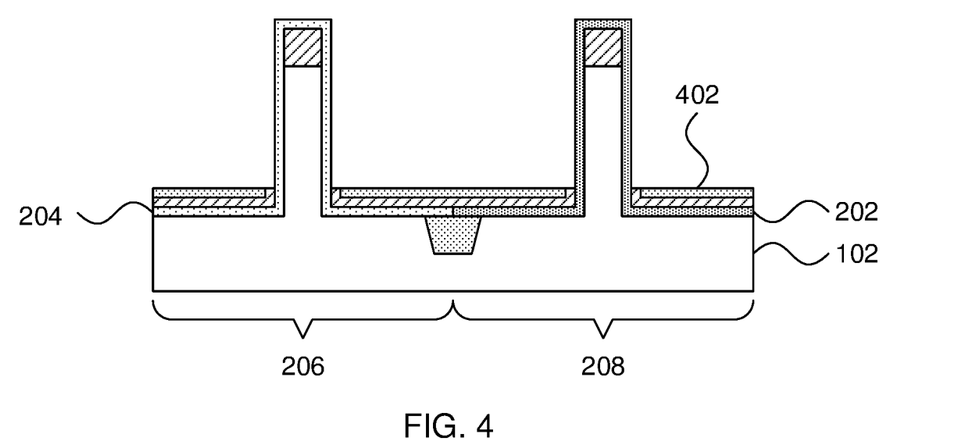
FIG. 4 is a cross-sectional diagram of a step in the formation of vertical transistors with solid-state in situ junction doping that shows the formation of bottom spacers in accordance with an embodiment of the present invention.

Referring now to FIG. 4, a cross-sectional view of a step in the fabrication of a semiconductor device is shown. The dummy fill layer 304 and the protective layer 302 are etched back to form bottom spacers 402. The protective layer 302 protects the doped oxide layers 202 and 204 during the etch of the dummy fill layer 304 and is then etched back. Thus it is specifically contemplated that two separate, selective etches can be used to form the bottom spacers 402.

Figure 5:
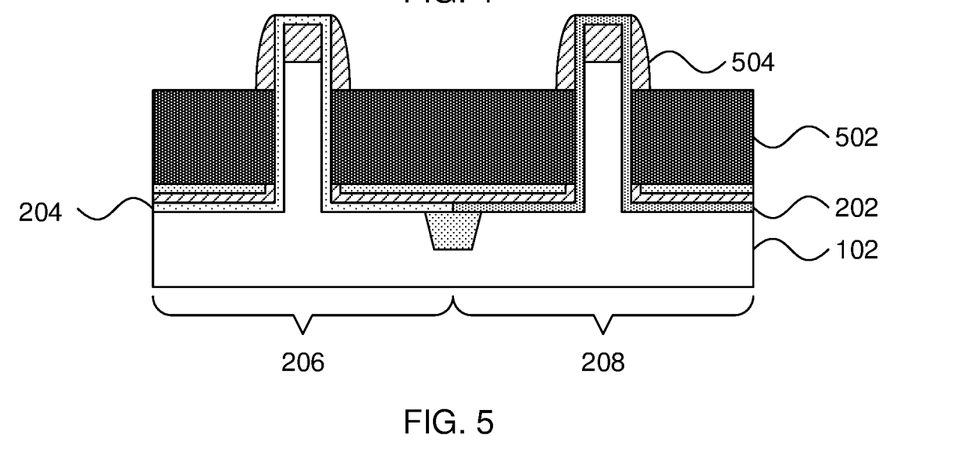
FIG. 5 is a cross-sectional diagram of a step in the formation of vertical transistors with solid-state in situ junction doping that shows the formation of upper spacers in accordance with an embodiment of the present invention.

Referring now to FIG. 5, a cross-sectional view of a step in the fabrication of a semiconductor device is shown. A second dummy fill 502 is deposited and etched back to a height below a top height of the fins 104. Sidewall spacers 504 are formed by conformally depositing a hardmask material and then anisotropically etching the hardmask material away from exposed horizontal surfaces. It is specifically contemplated that the second dummy fill 502 can be formed from a material such as, e.g., amorphous silicon, amorphous carbon, or amorphous silicon germanium. The spacers 504 may be formed by any appropriate hardmask material including, e.g., silicon nitride.

Figure 6:
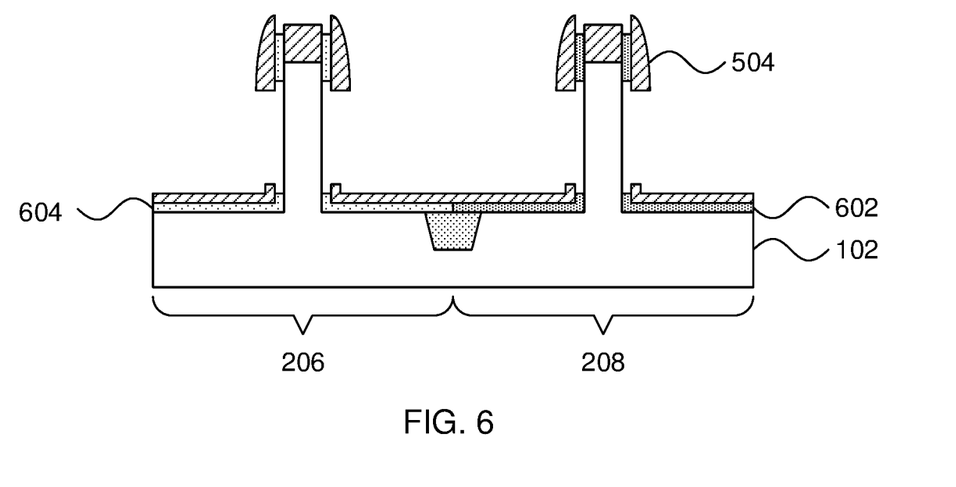
FIG. 6 is a cross-sectional diagram of a step in the formation of vertical transistors with solid-state in situ junction doping that shows the exposure of fin sidewalls between the upper and bottom spacers in accordance with an embodiment of the present invention.

Referring now to FIG. 6, a cross-sectional view of a step in the fabrication of a semiconductor device is shown. The second dummy fill 502 and the remainder of the first dummy fill 304 are etched away using any appropriate etch. It is contemplated that this etch will also etch back the doped oxide layers 202 and 204, leaving behind doped oxide remnants 604 and 606, with a bottom portion of each being protected by the bottom spacer 402 and with a top portion of each being protected by the sidewall spacers 504. The dopant diffusion anneal step can be performed after the second dummy fill 502 and the remainder of the first dummy fill 304 are etched away.

The particular details of the anneal process can be selected from any appropriate anneal process parameters, but it is specifically contemplated that embodiments of the present invention may use a rapid thermal anneal (RTA) or spike anneal. The temperature of the anneal can be between about 800° C. and about 1000° C., with an anneal time between about 5 s and about 120 s. The anneal can be performed in an environment of an inert gas like nitrogen or argon. This anneal can also be performed later in the fabrication process if the high temperature will not interfere with other components.

Figure 7:
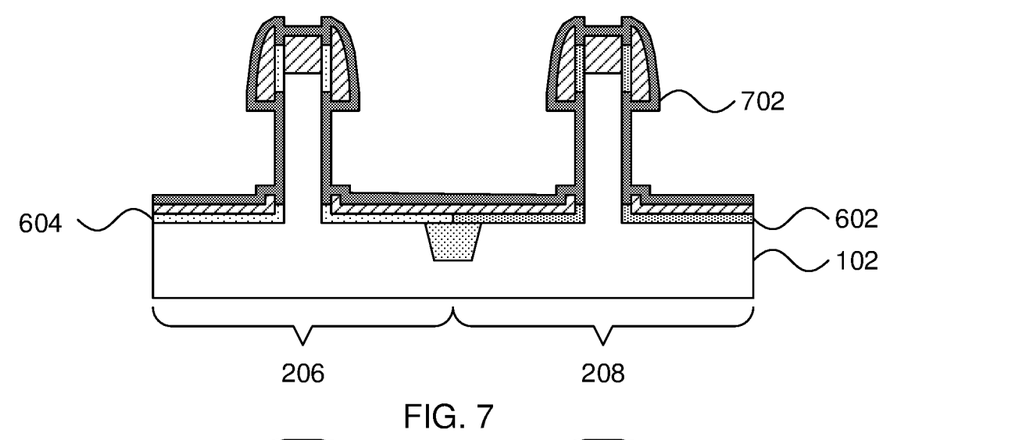
FIG. 7 is a cross-sectional diagram of a step in the formation of vertical transistors with solid-state in situ junction doping that shows the formation of a gate dielectric layer in accordance with an embodiment of the present invention.

Referring now to FIG. 7, a cross-sectional view of a step in the fabrication of a semiconductor device is shown. A gate dielectric layer 702 is conformally deposited over the exposed surfaces of the fins 104. Any appropriate dielectric material can be used for the gate dielectric layer 702, and it is specifically contemplated that a high-k material can be used. As used herein, the term, "high-k," refers to materials having a dielectric constant k that is higher than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

In some embodiments, an interfacial layer (not shown) can be deposited before the deposition of the gate dielectric layer 702. The interfacial layer can be formed from, e.g., silicon dioxide, other silicon oxides, silicon oxynitride, or any other appropriate oxide or oxynitride material.

Figure 8:
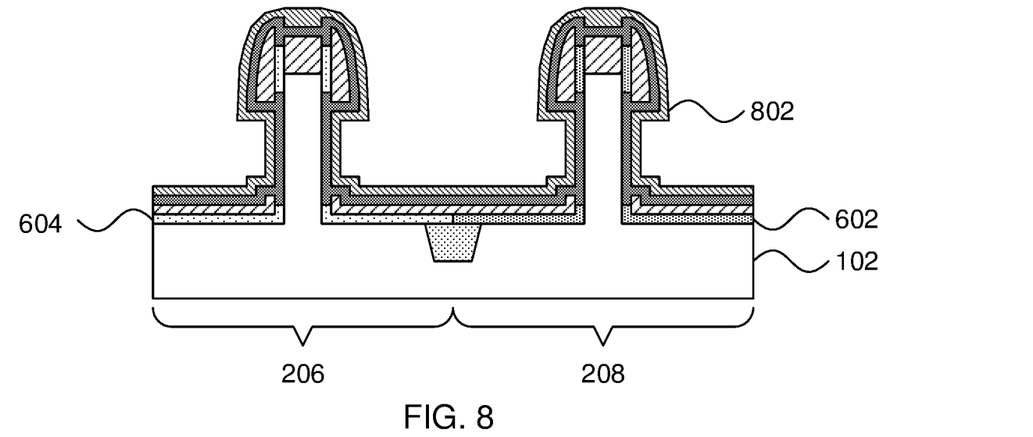
FIG. 8 is a cross-sectional diagram of a step in the formation of vertical transistors with solid-state in situ junction doping that shows the formation of a cap layer in accordance with an embodiment of the present invention.

Referring now to FIG. 8, a cross-sectional view of a step in the fabrication of a semiconductor device is shown. A cap layer 802 is conformally deposited over the fins 104. The cap layer is used to prevent the impact of encapsulation layer on the high k dielectric. In some embodiments, the cap layer can be formed from titanium nitride.

Figure 9:
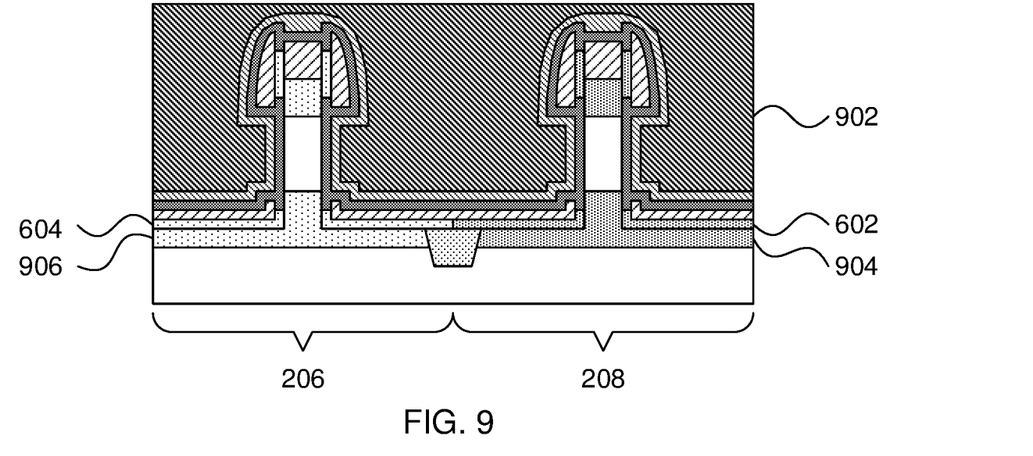
FIG. 9 is a cross-sectional diagram of a step in the formation of vertical transistors with solid-state in situ junction doping that shows the formation of upper and lower doped junctions in the semiconductor fins by annealing the doped dielectric layers in accordance with an embodiment of the present invention.

Referring now to FIG. 9, a cross-sectional view of a step in the fabrication of a semiconductor device is shown. An encapsulation layer 902 is deposited over the cap layer 802. An anneal is then performed. The anneal drives dopants from the doped oxide remnants 602 and 604 into the adjacent semiconductor material of the fins 104 and the underlying substrate 102. This creates doped semiconductor regions 904 and 906, each having a top portion at the top of the respective fin 104 and each having a bottom portion at the substrate 102. As noted above, the anneal can be performed at this stage or at an earlier stage and can be an RTA or spike anneal. The diffusion of dopants into the active channel region of the fins 104 is minimal, so that the overlap between the doped channel and the gate dielectric is small. The concentration of dopants that diffuse into the junction can be between about $1e^{18}$ and about $1e^{20}$ atoms/cm$^3$.

Figure 10:
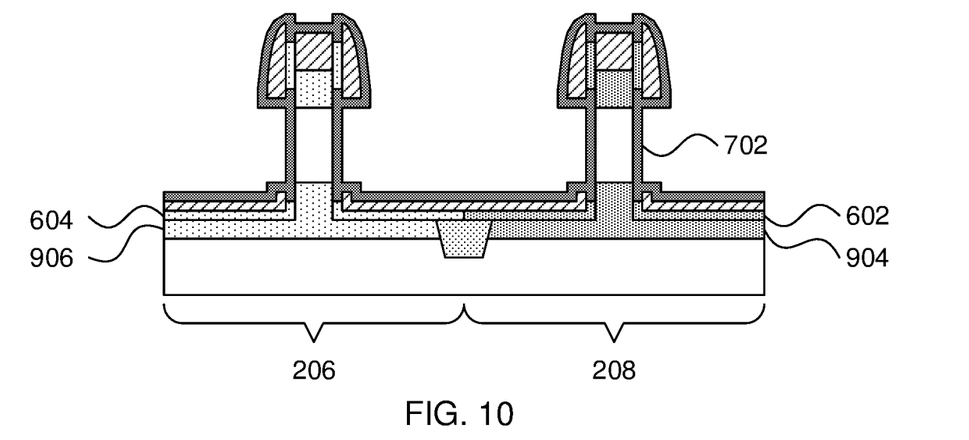
FIG. 10 is a cross-sectional diagram of a step in the formation of vertical transistors with solid-state in situ junction doping that shows the exposure of the gate dielectric layer in accordance with an embodiment of the present invention.

Referring now to FIG. 10, a cross-sectional view of a step in the fabrication of a semiconductor device is shown. The cap layer 802 and the encapsulation layer 902 are stripped away by any appropriate etch, exposing the gate dielectric layer 702.

Figure 11:
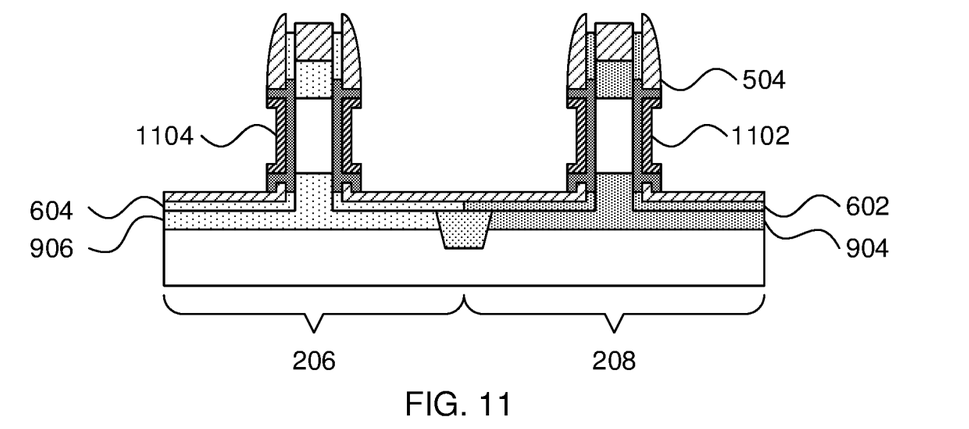
FIG. 11 is a cross-sectional diagram of a step in the formation of vertical transistors with solid-state in situ junction doping that shows the formation of a work function metal layer in accordance with an embodiment of the present invention.

Referring now to FIG. 11, a cross-sectional view of a step in the fabrication of a semiconductor device is shown. Work function metal layers 1102 and 1104 are formed over the gate dielectric layer 702 in the respective p-type device region 208 and n-type device region 206. It is specifically contemplated that the work function metal layer 1102 may be formed by conformally depositing an appropriate metal material and then anisotropically etching the metal material from any exposed surfaces using, e.g., a selective RIE. Exposed portions of the gate dielectric layer 702 can also be etched away at this time. The work function metal layers 1102 and 1104 are protected from the anisotropic etch by the sidewall spacers 504. The work function metal layers 1102 and 1104 can be formed from either a p-type work function metal layer or a p-type work function metal layer. The work function metal layers 1102 and 1104 may function as gate conductors for the devices. A work function metal encapsulation layer (not shown) can also be formed over the work function metal layers 1102 and 1104 in a similar fashion.

As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

Figure 12:
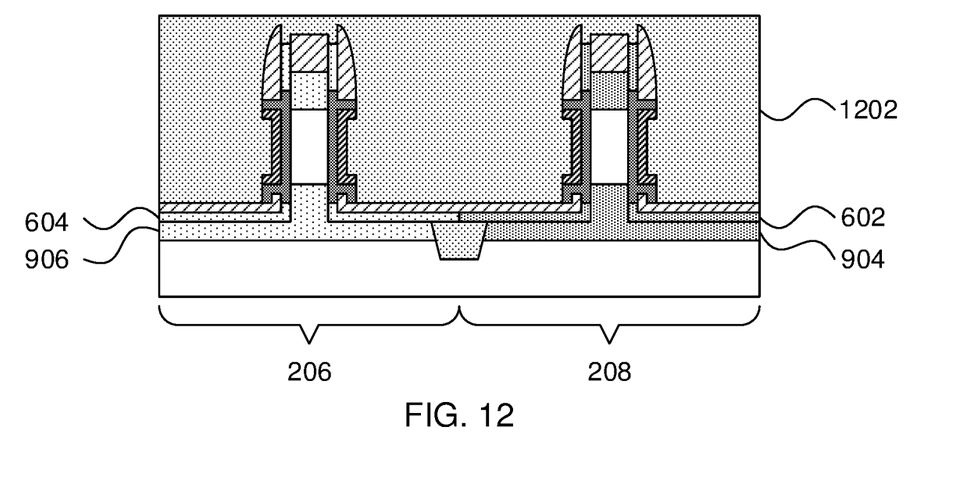
FIG. 12 is a cross-sectional diagram of a step in the formation of vertical transistors with solid-state in situ junction doping that shows the formation of a gap fill layer in accordance with an embodiment of the present invention.

Referring now to FIG. 12, a cross-sectional view of a step in the fabrication of a semiconductor device is shown. A gapfill dielectric 1202 is deposited using, e.g., a flowable CVD process. It is specifically contemplated that the gapfill dielectric 1202 may be formed from silicon dioxide, but it should be understood that any appropriate dielectric material may be used instead. An encapsulation layer or stack can be deposited before deposition of the gapfill dielectric 1202.

Figure 13:
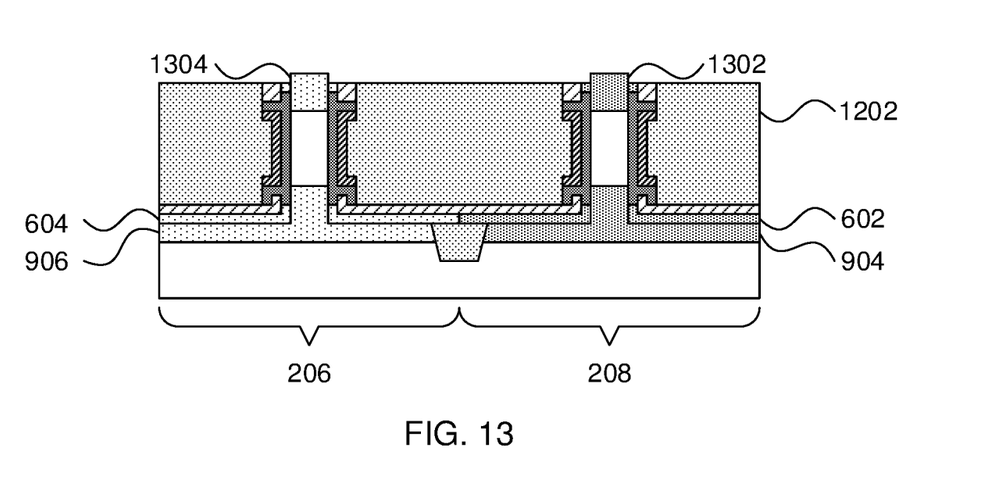
FIG. 13 is a cross-sectional diagram of a step in the formation of vertical transistors with solid-state in situ junction doping that shows the exposure of top junction regions of the semiconductor fins in accordance with an embodiment of the present invention.

Referring now to FIG. 13, a cross-sectional view of a step in the fabrication of a semiconductor device is shown. The various layers are etched back to expose the top portion of the fins 104 that include the top portion of the doped semiconductor regions 904 and 906. This process may include a first polishing step that stops on the fin masks 106 using chemical mechanical planarization (CMP). An etch that non-selectively removes material from the passivating dielectric 1202, the sidewall spacers 504, and the doped oxide remnants 602 and 604 without harming the semiconductor material of the doped semiconductor regions 904 and 906 exposes the top source/drain junctions 1302 and 1304. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 14:
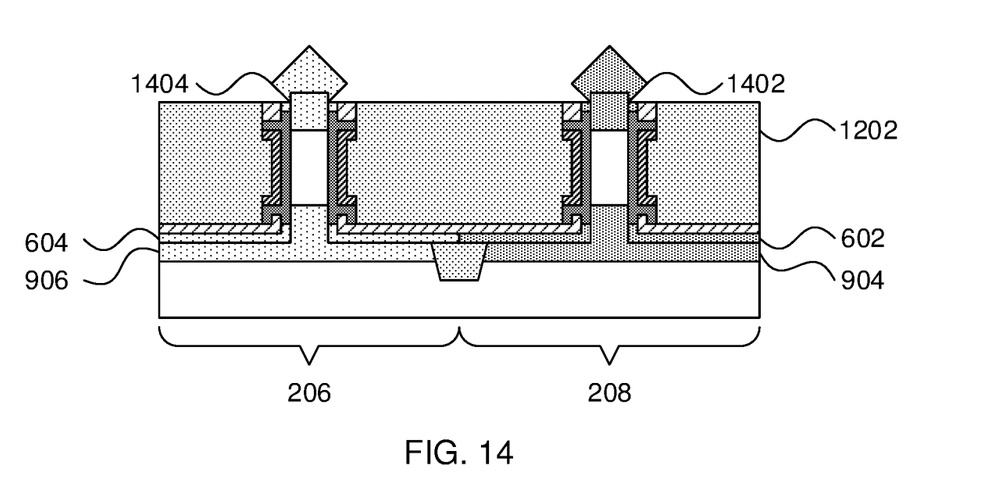
FIG. 14 is a cross-sectional diagram of a step in the formation of vertical transistors with solid-state in situ junction doping that shows the formation of top junction extensions on the semiconductor fins in accordance with an embodiment of the present invention.

Referring now to FIG. 14, a cross-sectional view of a step in the fabrication of a semiconductor device is shown. Top source/drain extensions 1402 and 1404 are epitaxially grown from the top source/drain junctions 1302 and 1304. The top source/drain extensions 1402 and 1404 can be formed with dopants appropriate to their respective device region (e.g., p-type or n-type dopants) and may also have a silicide layer to reduce contact resistance. At this point, an interlayer dielectric (not shown) can be deposited over the top source/drain extensions 1402 and 1404 and electrical contacts can be formed down to bottom source/drain contacts formed from bottom doped semiconductor regions in the substrate 102 and to the top source/drain extensions 1402 and 1404.

As noted above, the top and bottom source/drain regions can each be doped by in situ solid state doping or can be formed by other processes. In specifically contemplated embodiments, the bottom source/drain regions can be doped by implantation, or by epitaxial growth with in situ doping. In another embodiment, the top source/drain junctions can be formed by an early epitaxial growth process with in situ doping, before formation of the fins 104, after which further doping can be performed using the doped dielectric layers 202 and 204.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises." "comprising," "includes" and/or "including." when used herein, specify the presence of stated features, integers, steps, operations, elements and/or components, but do not preclude the presence or addition of one or more other features, integers, steps, operations, elements, components and/or groups thereof.

Spatially relative terms, such as "beneath." "below." "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 15:
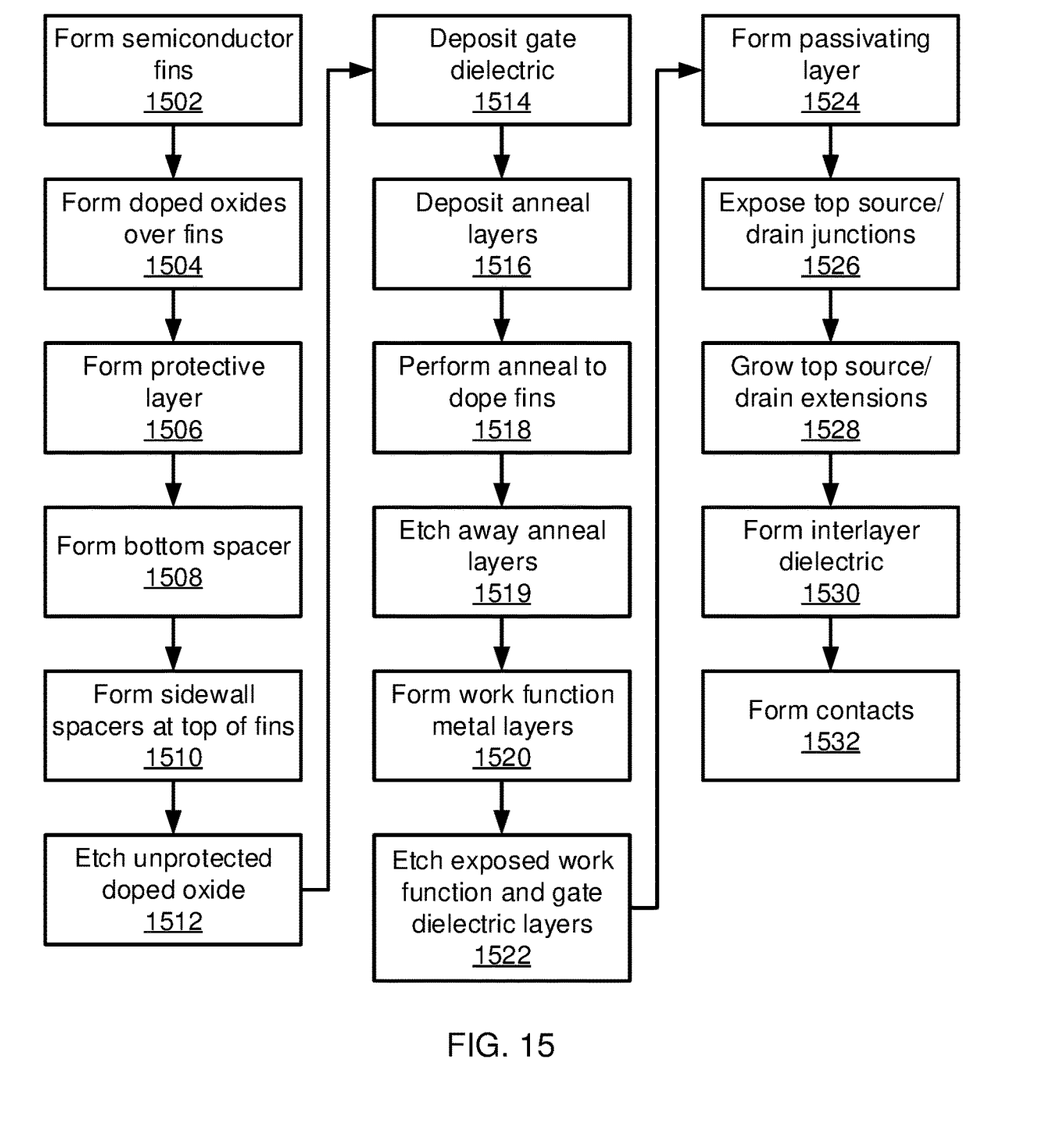
FIG. 15 is a block/flow diagram of a method for forming vertical transistors with solid-state in situ junction doping in accordance with an embodiment of the present invention.

Referring now to FIG. 15, a method of forming vertical FETs with in situ solid state doped junctions is shown. Block 1502 forms semiconductor fins 104 on a semiconductor substrate 102 by, e.g., anisotropically etching down into a semiconductor layer using an etch mask 106. Block 1504 forms doped oxide layers 202 and 204 on respective device regions 208 and 206. Block 1506 then forms protective layer 302, with dummy fill 304 formed over it from any appropriate material.

Block 1508 etches back the dummy fill 304 and the protective layer 302 to form bottom spacers 402. Block 1510 forms sidewall spacers 504 at the top ends of the fins 104, for example by depositing a second fill 502 to a height below the top of the fins 104 and then conformally depositing a spacer material such as silicon nitride and etching the spacer material from horizontal surfaces using an anisotropic etch. Block 1510 then etches away the second fill 502 to expose the underlying doped oxide layers 202 and 204 on sidewalls of the fins 104.

Block 1512 etches away portions of the doped oxide layers 202 and 204 that are not covered by the lower spacers 402 or the sidewall spacers 504. Block 1514 conformally deposits a gate dielectric layer 702 using any appropriate deposition process and dielectric material. Block 1516 conformally forms cap layer 802 and encapsulating layer 902. Block 1518 then performs an anneal that drives dopants from the doped oxide remnants 602 and 604 into the semiconductor fins 104 and the semiconductor substrate 102, forming doped semiconductor regions 904 and 906. Block 1519 etches away the cap layer 802 and the encapsulating layer 902.

Block 1520 forms work function metal by conformally depositing in both device regions. Block 1522 anisotropically etches away any exposed portions of the work function metal and the gate dielectric 702 to form gate stacks that include work function metal layers 1102 and 1104. Block 1524 forms interlayer layer 1202 over the device regions 206 and 208.

Block 1526 exposes the tops of source/drain junctions 1302 and 1304 by, e.g., polishing down the passivating layer 1202 and then applying an etch that affects both the oxide and nitride materials of the interlayer dielectric 1202, the sidewall spacers 504, and the doped oxide remnants. Block 1528 epitaxially grows top source/drain extensions 1402 and 1404 with in situ doping. Block 1530 forms an interlayer dielectric (not shown) over the top source/drain extensions 1402 and 1404. Block 1532 forms conductive contacts (not shown) down to the bottom source/drain regions formed by doped semiconductor regions 904 and 906 in the semiconductor substrate 102 and to the top source/drain extensions 1402 and 1404.

Having described preferred embodiments of self-aligned top spacers for vertical FETs with in-situ solid state doping (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
   forming a doped dielectric layer on sidewalls of a top region of a semiconductor fin, leaving a middle region of the semiconductor fin exposed;
   annealing the doped dielectric layer to drive dopants from the doped dielectric layer into the top region of the semiconductor fin; and forming a gate stack on the middle region of the semiconductor fin.

2. The method of claim 1, wherein forming the doped dielectric layer comprises:
conformally depositing a layer of doped dielectric material on the fin;
forming sidewall spacers on the doped dielectric material that cover the top region of sidewalls of the semiconductor fin; and
etching away material from the layer of doped dielectric material that is not covered by the sidewall spacers.

3. The method of claim 1, wherein forming the doped dielectric layer comprises forming a doped dielectric layer on a substrate that is under the semiconductor fin.

4. The method of claim 3, wherein forming the doped dielectric layer further comprises:
conformally depositing a layer of doped dielectric material over the substrate and on the semiconductor fin;
forming bottom spacers on the doped dielectric material that cover a bottom region of sidewalls of the semiconductor fin and at least a portion of the semiconductor substrate; and
etching away material from the layer of doped dielectric material that is not covered by the sidewall spacers, leaving the middle region of the semiconductor fin exposed.

5. The method of claim 1, wherein the doped dielectric layer consists of a material selected from the group consisting of phosphosilicate glass and borosilicate glass.

6. The method of claim 1, wherein forming the gate stack comprises:
forming sidewall spacers that cover the top region of sidewalls of the semiconductor fin;
conformally forming a gate dielectric material on the middle region of the semiconductor fin;
conformally forming a gate conductor material on the gate dielectric layer; and
anisotropically etching away any gate dielectric material and the gate conductor material that is not protected by the sidewall spacers.

7. The method of claim 1, wherein forming the doped dielectric layer comprises forming the doped dielectric layer on sidewalls of a top region of the semiconductor fin and on a substrate that is under the semiconductor fin.

8. A method of forming an integrated chip, comprising:
forming a first doped dielectric layer, comprising a dopant of a first conductivity type, on a top region of a first semiconductor fin, leaving a middle region of the first semiconductor fin exposed;
forming a second doped dielectric layer, comprising a dopant of a second conductivity type, on a top region of a second semiconductor fin, leaving a middle region of the second semiconductor fin exposed;
annealing the first doped dielectric layer and the second doped dielectric layer to drive dopants from the respective doped dielectric layers into the respective top regions of the respective semiconductor fins;
forming a first gate stack on the first semiconductor fin; and
forming a second gate stack on the second semiconductor fin.

9. The method of claim 8, wherein the first doped dielectric layer is formed from phosphosilicate glass and the second doped dielectric layer is formed from borosilicate glass.

10. The method of claim 8, further comprising forming a shared bottom spacer between the first semiconductor fin and the second semiconductor fin.

11. A method of forming a semiconductor device, comprising:
forming a first doped dielectric layer on sidewalls of a top region of a semiconductor fin;
forming a second doped dielectric layer on sidewalls of a bottom region of the semiconductor fin, leaving a middle region, between the top region and the bottom region, exposed;
annealing the doped dielectric layer to drive dopants from the doped dielectric layer into the respective top and bottom regions of the semiconductor fin; and
forming a gate stack on the middle region of the semiconductor fin.

12. The method of claim 11, wherein forming the first doped dielectric layer comprises:
conformally depositing a layer of doped dielectric material on the fin;
forming sidewall spacers on the doped dielectric material that cover the top region of sidewalls of the semiconductor fin; and
etching away material from the layer of doped dielectric material that is not covered by the sidewall spacers.

13. The method of claim 11, wherein forming the second doped dielectric layer comprises forming the second doped dielectric layer on a substrate that is under the semiconductor fin.

14. The method of claim 13, wherein forming the second doped dielectric layer further comprises:
conformally depositing a layer of doped dielectric material over the substrate and on the semiconductor fin;
forming bottom spacers on the doped dielectric material that cover the bottom region of sidewalls of the semiconductor fin and at least a portion of the semiconductor substrate; and
etching away material from the layer of doped dielectric material that is not covered by the sidewall spacers.

15. The method of claim 11, wherein the first and second doped dielectric layers consist of a material selected from the group consisting of phosphosilicate glass and borosilicate glass.

16. The method of claim 11, wherein forming the gate stack comprises:
forming sidewall spacers that cover the top region of sidewalls of the semiconductor fin;
conformally forming a gate dielectric material on the middle region of the semiconductor fin;
conformally forming a gate conductor material on the gate dielectric layer; and
anisotropically etching away any gate dielectric material and the gate conductor material that is not protected by the sidewall spacers.

* * * * *